United States Patent [19]
Jensen et al.

[11] Patent Number: 5,142,231
[45] Date of Patent: Aug. 25, 1992

[54] MAGNETIC RESONANCE METHOD AND DEVICE FOR SUPPRESSING A SIGNAL FROM A CHEMICAL SHIFT COMPONENT IN A LONGITUDINAL RELAXATION TIME WEIGHTED MAGNETIC RESONANCE IMAGE

[75] Inventors: Jens D. Jensen, Hamburg, Fed. Rep. of Germany; Peter R. Luyten, Eindhoven, Netherlands

[73] Assignee: U.S. Philips Corporation

[21] Appl. No.: 436,519

[22] Filed: Nov. 14, 1989

[30] Foreign Application Priority Data

Nov. 25, 1988 [EP] European Pat. Off. ............ 88202690

[51] Int. Cl.⁵ .......................................... G01R 33/20
[52] U.S. Cl. .................................... 324/309; 324/307
[58] Field of Search .............. 324/311, 307, 309, 310; 128/653 R, 653 A, 653 AF, 653 SC

[56] References Cited

U.S. PATENT DOCUMENTS

| | | | |
|---|---|---|---|
| 4,695,799 | 9/1987 | Hardy et al. | 324/311 |
| 4,754,223 | 6/1988 | In Den Kleef et al. | 324/309 |
| 4,847,559 | 7/1989 | Keren | 324/309 |
| 4,855,679 | 8/1989 | Granot | 324/309 |
| 4,868,501 | 9/1989 | Conolly | 324/309 |

FOREIGN PATENT DOCUMENTS 0104781 4/1984 European Pat. Off. ............ 324/309

OTHER PUBLICATIONS

Hutchison et al., Instrumentation for NMR spin-warp imaging, Aug. 10, 1981, pp. 74-79.

Beall et al., NMR Handbook for Biomedical Applications 1984, p. 34.

C. H. Oh et al., "Selective Partial Inversion Recovery (SPIR) in Steady State for Selective Saturation Magnetic Resonance Imaging (MRI)", Book of Abstracts, vol. 2, Society of Magnetic Resonance in Medicine, Seventh Annual Meeting and Exhibition, San Francisco, Aug. 20-26, 1988. p. 1042.

J. C. Sharp et al., "3D Localized Shimming With Fat Suppression For Use With Surface Coils", Book of Abstracts, vol. 2, Society of Magnetic Resonance in Medicine, Seventh Annual Meeting and Exhibition, San Francisco, Aug. 20-26, 1988, p. 745.

M. Garwood et al., "1H Spectroscopy Using Solvent Suppression Adiabatic Pulses (SSAP)", Book of Abstracts, vol. 2, Society of Magnetic Resonance in Medicine, Seventh Annual Meeting and Exhibition, San Francisco, Aug. 20-26, 1988, p. 754.

S. Conolly et al., "A Selective Adiabatic Spin-echo Pulse", Book of Abstracts, vol. 2, Society of Magnetic Resonance in Medicine, Seventh Annual Meeting and Exhibition, San Francisco, Aug. 20-26, 1988, p. 661.

*Primary Examiner*—Stephen C. Pellegrino
*Assistant Examiner*—Steven J. Shumaker

[57] ABSTRACT

An improved MRI sequence for suppressing a signal from a chemical shift component avoids image artifacts due to relatively large rf fields inhomogeneities as may be caused by using linearly polarized rf fields by selectively inverting the chemical shift component by means of an adiabatic fast passage rf pulse prior to spin echo excitation.

14 Claims, 2 Drawing Sheets

MAGNETIC RESONANCE METHOD AND DEVICE FOR SUPPRESSING A SIGNAL FROM A CHEMICAL SHIFT COMPONENT IN A LONGITUDINAL RELAXATION TIME WEIGHTED MAGNETIC RESONANCE IMAGE

BACKGROUND OF THE INVENTION

The invention relates to a magnetic resonance method for suppressing a signal from a chemical shift component in a magnetic resonance image of a body, the method comprising successive steps of situating the body in a stationary homogeneous magnetic field, irradiating the body with a 180° chemical shift selective rf-pulse being frequency selective to the chemical shift component, applying a dephasing magnetic field gradient, and applying a delay time after the 180° rf-pulse a spin-echo acquisition scheme for acquiring magnetic resonance signals from the body, the scheme comprising at least one phase-encoding gradient and the delay time being such that at the start of the spin-echo acquisition scheme a mean longitudinal relaxation component of said chemical shift component will be approximately zero, said successive steps being repeated a number of times, whereby the image is reconstructed by means of a Fouriertransformation of samples from the magnetic resonance signals.

The invention further relates to a magnetic resonance device for suppressing a signal from a chemical shift component in a magnetic resonance image of a body, which device comprises means for generating a stationary homogeneous magnetic field, means for irradiating rf-pulses to the body, modulating means for modulating the rf-pulses, receiving and demodulating means for receiving and demodulating excited magnetic resonance signals, sampling means for sampling the magnetic resonance signals and control means for controlling the means for irradiating rf-pulses, the modulating means, the receiving and demodulating means and the sampling means being such that the signal from said chemical shift component is attenuated and that a signal from other components is achieved, the device further comprising Fourier transform means for reconstructing an image from the sampled magnetic resonance signals.

Such a method and device are known from the Abstract, "Selective Partial Inversion Recovery (SPIR) in Steady State for Selective Saturation Magnetic Resonance Imaging (MRI)", Book of Abstracts, SMRM 1988, page 1042. Therein it is suggested to suppress fat signals in MRI by first applying a partial inversion, frequency selective rf-pulse to a body situated in a homogeneous magnetic field, then applying a dephasing gradient and finally applying a spin-echo scheme with a 90° spatially selective rf-pulse and a non-selective 180° pulse. Said partial inversion rf-pulse is an amplitude modulated pulse. The suppression is achieved by using a delay time between the partial inversion rf-pulse and the 90° pulse such that the 90° pulse is applied at the time of the zero-crossing of longitudinal relaxation of the chemical shift component and by dephasing the remaining transverse magnetization components. Transverse magnetization is dephased by the dephasing gradient applied after the frequency selective, partial inversion pulse. In said method the partial inversion rf-pulse has typical values of 120°–130° corresponding to a delay time of 30–40 ms for SE-fat suppression sequences. In vivo T1-relaxation for fat (in the order of 250 ms) is much shorter than for water. As a range for the flip angle of the partial inversion pulse angles of 90°–180° are specified. It should be noticed here that a 180° inversion pulse will not give partial but full inversion. It is stated that for large rf-field inhomogeneities the partial inversion pulse should be increased to 180° to make magnetization less sensitive for the inhomogeneities. It is found however that increasing of the amplitude modulated partial inversion pulse to 180° still does not give satisfactory results; still unacceptable image artifacts remain. Said method is sensitive for inhomogeneities in the stationary magnetic field and in the rf-field. Where image detail is required of tissue surrounded by fat as is the case when imaging e.g. an optic nerve in a human head said fat suppression method will not give uniform fat suppression. To clearly visualize small detailed structures excellent fat suppression will be necessary. When e.g. a human head is imaged with said method, using a linearly polarized head-coil, giving rise to relatively large rf-inhomogeneities, said method does not give satisfactory results.

SUMMARY OF THE INVENTION

It is an object of present invention to improve said method.

A method according to present invention is therefore characterized in that the 180° chemical shift selective rf-pulse is an adiabatic fast passage inversion rf-pulse. The adiabatic fast passage pulse is applied as a frequency selective inversion pulse at the resonance frequency of said chemical shift component, e.g. that of fat. The adiabatic fast passage pulse can be applied as an amplitude and frequency (or phase) modulated pulse. Measuring results have shown excellent lipid suppression e.g. in imaging the optic nerve with linearly polarized head-coils and in transverse abdominal body images.

An embodiment of a method according to present invention is characterized in that the adiabatic fast passage rf-pulse is a complex hyperbolic secant pulse multiplied by a Gaussian weighting function. This pulse shape yields good results. In itself a complex hyperbolic secant pulse is described in Journal of Magnetic Resonance, "Highly Selective $\pi/2$ and $\pi$ Pulse Generation", M. S. Silver et al., Vol. 59, pp. 347–351, 1984, on page 350 thereof. Above a critical threshold, the inversion and selectively are independent of the applied rf-power. It is further found that multiplying said hyperbolic secant pulse with a Gaussian weighting function gives even better results.

BRIEF DESCRIPTION OF THE DRAWING

The features and advantages of the method and device according to the invention will be more clearly apparent from the following detailed description, in conjunction with the accompanying drawing, wherein.

DETAILED DESCRIPTION OF THE PREFERRED EMBODIMENTS

Figure 1A:
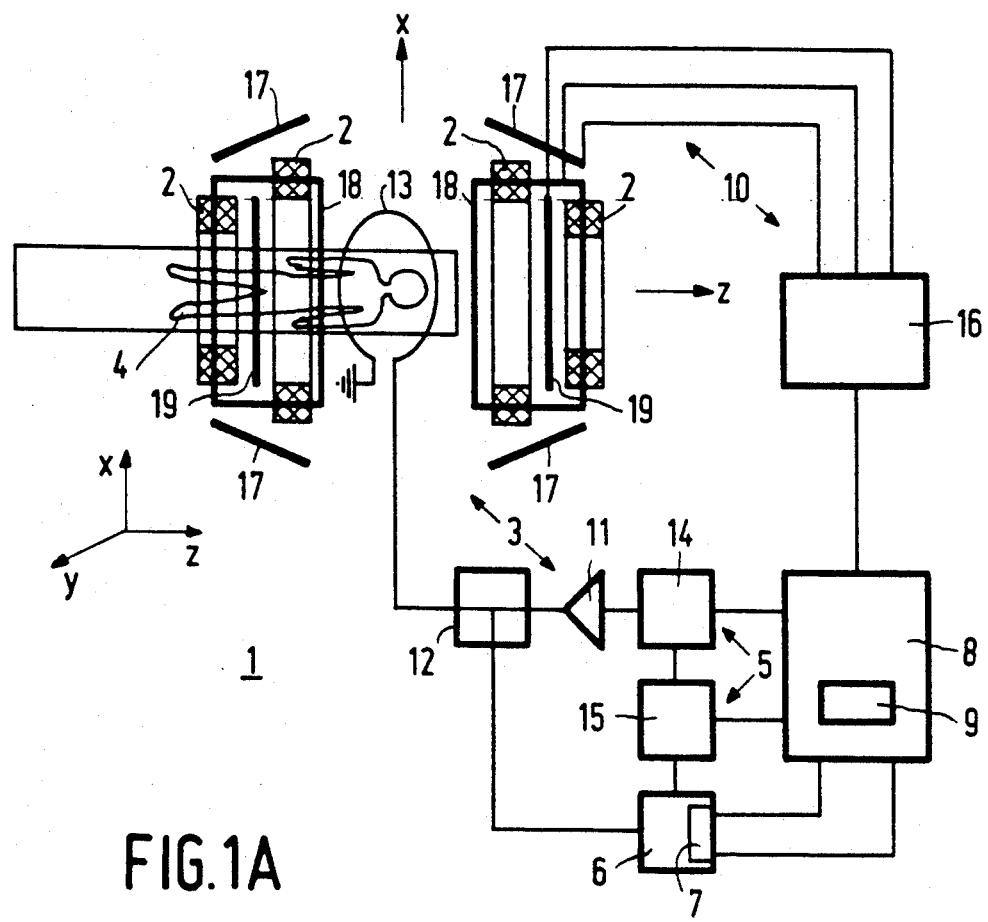
FIG. 1A shows, diagrammatically, a magnetic resonance device according to the invention.

In FIG. 1A there is shown, diagrammatically, a magnetic resonance device 1 according to the invention comprising means 2 for generating a stationary homogeneous magnetic field, means 3 for irradiating rf-pulses to a body 4, modulating means 5 for modulating the rf-pulses, receiving and demodulating means 6 for receiving and demodulating excited magnetic resonance signals with sampling means 7 for sampling the magnetic resonance signals and control means 8 for controlling said means 3,5,6 and 7. The device 1 further comprises Fourier transform means 9 for reconstructing an image from the sampled magnetic resonance signals, means 10 for generating magnetic field gradients which are superimposed upon the stationary magnetic field. In further detail the means 3 comprise the means 5, a power amplifier 11, a directional coupler 12 and a coil 13. The means 5 comprise a modulator 14 and an oscillator 15. The modulation can be in amplitude and frequency or phase under control of the means 8. The means 3 will excite nuclear spins in the body 4 when transmitting rf-pulses and the means 6 will receive magnetic resonance signals in response thereupon. The transmission and reception may have various embodiments e.g. the coil 13 can be a transmit/receive coil or can be embodied separately as a so-called whole body transmit coil and a so-called head coil for reception. In case of a separate embodiment there will be no directional coupler 12. The demoduling means 6 may comprise a quadrature demodulator in which case the sampling means will comprise two A/D-converters giving quadrature detected samples of respective sin and cos components of the magnetic resonance signal. The means 10 comprise a power supply 16 to be controlled by the control means 8, for separately controlling gradient magnetic coils 17, 18 and 19 for respective generation of magnetic field gradients Gx, Gy and Gz. The gradient magnet coils may be arranged such that the field direction of the magnetic field gradients coincides with the direction of the stationary homogeneous magnetic field and that the directions of the gradients are perpendicular to each other, indicated in FIG. 1A with axes x, y and z perpendicular to each other. If the device 1 is put into operation and the object 4 is placed inside the magnet cvoils 2 a small excess of nuclear spins (of nuclei with a magnetic moment) will be directed into the direction of the stationary homogeneous magnetic field, which can be considered macroscopically as a magnetization M, an equilibrium magnetization. For a more detailed description of an MRI device and a general description of the principles of MRI referred is to the handbook, "Practical NMR Imaging", M. A. Foster and J. M. S. Hutchinson, 1987 IRL Press.

Figure 1B:
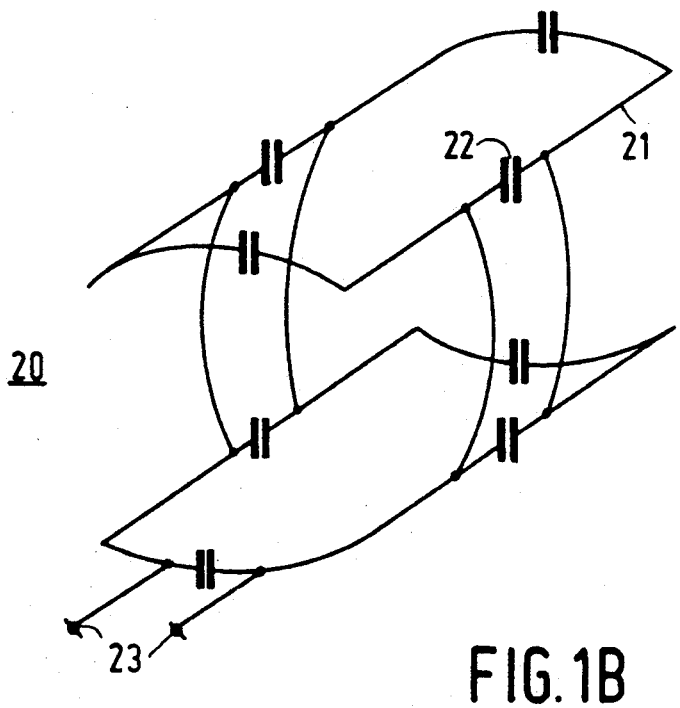
FIG. 1B shows a head coil for receiving magnetic resonance signals.

In FIG. 1B a head coil 20 for receiving magnetic resonance signals is shown. The coil 20 fits around a head of the (human) body 4. According to present invention the coil 20 is used to pick up magnetic resonance signals from a slice of the head e.g., whereby a signal from a chemical shift component is suppressed. As is well known magnetic resonance frequency is dependent on the chemical environment of nuclei. Fat-bound protons exhibit a lower resonance frequency than water-bound protons. The head coil 20 is in the form of a cylindrical arrangement with appropriate bars and capacitors 21 and 22 as shown. With connection terminals 23 the head coil 20 is coupled to the receiving and demodulating means 6. With the frequently used head-coil 20 shown, so-called linearly polarized radio frequency excitation and reception is possible, giving rise to relatively large rf field inhomogeneities within the object 4 due to interaction of electromagnetic energy with lossy dielectrics. The rf-field inhomogeneities cause image artifacts. The above phenomena are described in detail in the article, "Comparison of Linear and Circular Polarization for Magnetic Resonance Imaging", G. H. Glover et al, Journal of Magnetic Resonance, Vol. 64, pp. 255-270, 1985.

Figure 2A:
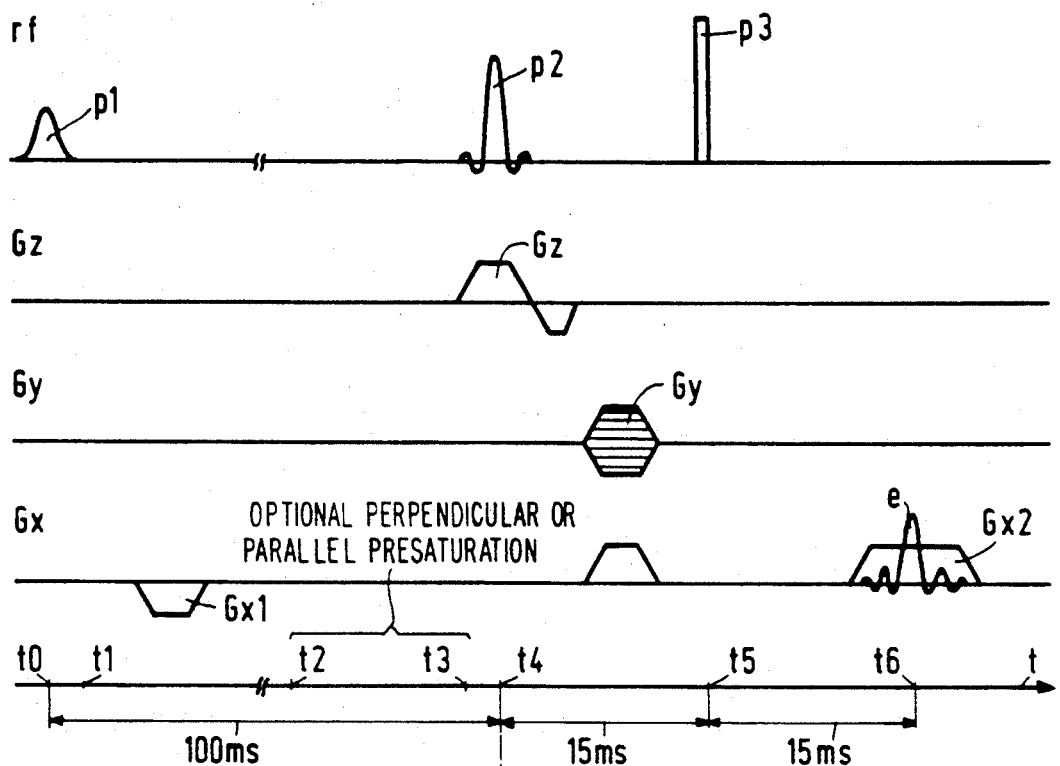
FIG. 2A shows a pulse sequence according to the invention.
Figure 2B:
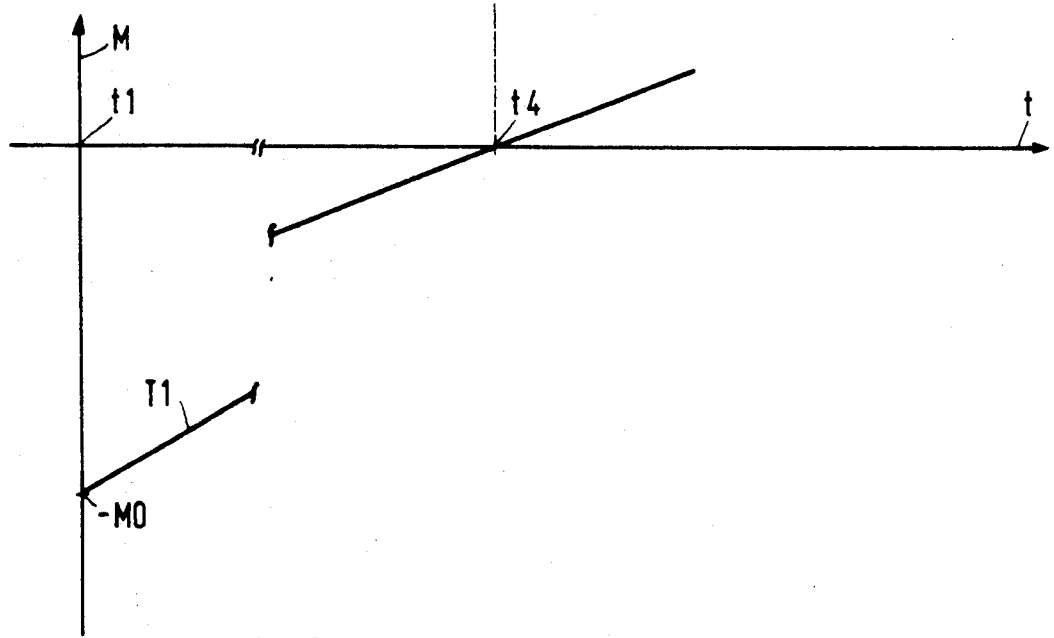
FIG. 2B shows longitudinal relaxation of magnetization of a chemical shift component to be suppressed.

In FIG. 2A there is shown a pulse sequence according to the invention. With means 3,5 and 8 an adiabatic fast passage rf-pulse is generated for the chemical shift selective excitation of the spin system in e.g. a head or an abdomen of a human body 4. The rf-pulse p1 is both amplitude and frequency modulated and gives rise to a selective inversion of spin nuclei e.g. of lipid spin nuclei. For convenience only the amplitude of the rf-pulse is shown. A rf-pulse giving excellent selective inversion, independent of rf inhomogeneity above a predetermined threshold, appeared to be a complex hyperbolic secant pulse multiplied by a Gaussian weighting function, according to $f(t)=\exp\{-((Bt)^2)/2\}$, B being a constant, e.g. B=0.5. The secant pulse is described by C. $\{sech(a.t)\}^{1+i.b}$, wherein C, a and b are real constants, t is a time-variable and i denotes the pulse is complex, i.e. $i=\sqrt{-1}$. For more detail referred is to said article of Silver et al. After the rf-pulse at t=to, the lipid magnetization components will have been inverted at t=t1, and a successive dephasing gradient e.g. G×1 is applied for dephasing undesired transverse magnetization which might be left due to slight imperfectness of the inversion. The secant pulse approximately effects a width of a selected region $\Delta\omega=a.b$. In a subsequent spin-echo scheme a spatially selective 90° rf-pulse p2 is applied via the means 3. Spatial selectivity is achieved by modulating the rf-pulse p2 and by applying a slice selective gradient Gz. The pulse p2 is applied at t=t4 when longitudinal relaxation of the excited lipids is such that the magnetization M of lipids has relaxed to zero, which is shown in FIG. 2B. Initially the lipid magnetization is inverted giving rise to magnetization M=−Mo at t=t1. By longitudinal relaxation T1 M=0 at t=t4. Since there is no longitudinal magnetization of the lipid signal left at t=t4 the rf-pulse p2 will only cause a measurable transverse magnetization of the remaining spectral components i.e. that of water e.g. Subsequent phase encoding of the transverse magnetization with a phase encoding gradient Gy, non-selective inversion with a hard 180° rf-pulse p3 and sampling a magnetic resonance spin echo signal e in the presence of a readout G×2 and repetition of said sequence for different phase encodings Gy will give samples from which after Fourier transform with means 9 a 2D-image of said slice is obtained with excellent lipid signal suppression even in the presence of relatively large rf field inhomogeneities.

It is to be noticed that numerous variations can be made. So, the spin echo signal may be a gradient recalled echo. Furthermore the delay time t0-t4 between the pulses p1 and p2, typically 100 ms for lipid suppression in a 1.5 T system at a repetition time of 450 ms, can be used, between the instants t−t2 and t=t3, for other purposes such as spatial presaturation. In case of so-called perpendicular presaturation motion artifacts can be reduced due to e.g. respiratory or cardiac motion. Perpendicular presaturation can furthermore be used to reduce the field of view (zooming to improve image resolution). In case of so-called parallel presaturation flow artifacts due to nuclear spins flowing in or out of a slice to be imaged can be reduced. Pulse and gradient switching for spatial presaturation are known per se.

We claim:

1. Magnetic resonance method for suppressing a signal from a chemical shift component in a magnetic resonance image of a body, the method comprising successive steps of situating the body in a stationary substantially homogeneous magnetic field, irradiating the body with a 180° chemical shift selective rf-pulse being frequency selective to the chemical shift component for inverting a longitudinal magnetization due to said chemical shift component, applying a dephasing magnetic field gradient, and after a predetermined delay time after the 180° rf-pulse applying a spin-echo acquisition scheme for acquiring magnetic resonance signals from the body, the scheme comprising at least one phase encoding gradient and the delay time being such that at the start of the spin-echo acquisition scheme a mean longitudinal magnetization due to said chemical shift component is on account of relaxation approximately zero, said successive steps being repeated a number of times, whereby the image is reconstructed by means of a Fourier transformation of samples from the magnetic resonance signals, characterized in that the 180° chemical shift selective rf-pulse is an adiabatic fast passage inversion rf-pulse.

2. Magnetic resonance method according to claim 1, characterized in that the adiabatic fast passage rf-pulse is a complex hyperbolic secant pulse, multiplied by a Gaussian weighting function.

3. Magnetic resonance method according to claim 2, characterized in that during the delay time and after the dephasing gradient a perpendicular presaturation scheme is applied in order to suppress image artifacts due to body movement.

4. Magnetic resonance method according to claim 2, characterized in that during the delay time and after the dephasing gradient a parallel presaturation scheme is applied in order to suppress image artifacts due to flow in the body.

5. Magnetic resonance method according to claim 1, characterized in that during the delay time and after the dephasing gradient a perpendicular presaturation scheme is applied in order to suppress image artifacts due to body movement.

6. Magnetic resonance method according to claim 5, characterized in that the spin-echo scheme successively comprises a spatially selective 90° rf-pulse, a phase-encoding magnetic field gradient, a 180° rf-pulse and a measurement gradient applied during occurrence of an excited spin-echo resonance signal.

7. Magnetic resonance method according to claim 1, characterized in that during the delay time and the dephasing gradient a parallel presaturation scheme is applied in order to suppress image artifacts due to flow in the body.

8. Magnetic resonance method according to claim 7, characterized in that the spin-echo scheme successively comprises a spatially selective 90° rf-pulse, a phase-encoding magnetic field gradient, a 180° rf-pulse and a measurement gradient applied during occurrence of an excited spin-echo resonance signal.

9. Magnetic resonance method according to claim 1, characterized in that the spin-echo scheme successively comprises a spatially selective 90° rf-pulse, a phase-encoding magnetic field gradient, a 180° rf-pulse and a measurement gradient applied during occurrence of an excited spin-echo resonance signal.

10. Magnetic resonance method according to claim 1, characterized in that the chemical shift component is lipid.

11. Magnetic resonance device including means for suppressing a signal from a chemical shift component in a magnetic resonance image of a body, which device comprises means for generating a stationary homogeneous magnetic field, means for generating gradient magnetic fields superimposed on the homogeneous magnetic field, means for irradiating rf-pulses to the body, modulating means for modulating the rf-pulses, receiving and demodulating means for receiving and demodulating excited magnetic resonance signals, sampling means for sampling the magnetic resonance signals, and control means for controlling the means for irradiating rf-pulses, the modulating means, the gradient magnetic field generating means, the receiving and demodulating means and the sampling means being such that the signal from said chemical shift component is attenuated and that a signal from other components is achieved, the device further comprising Fourier transform means for reconstructing an image from the sampled magnetic resonance signals, characterized in that the control means is configured to control the modulating means and the gradient magnetic field generating means to: carry out amplitude frequency or phase modulation in order to apply to the body a 180° adiabatic fast passage inversion rf-pulse for chemical shift selective inversion of the longitudinal magnetization due to said chemical shift component; to apply to the body a dephasing gradient following said inversion rf-pulse; and to apply to the body a spin-echo acquisition scheme commencing a predetermined delay time after the inversion rf-pulse, said delay time being such that a mean longitudinal magnetization due to said chemical shift component is on account of relaxation approximately zero at the commencement of the spin-echo acquisition scheme.

12. Magnetic resonance device according to claim 11, characterized in that the adiabatic fast passage rf-pulse is a complex hyperbolic secant pulse, multiplied by a Gaussian weighting function.

13. Magnetic resonance device according to claim 11 characterized in that the spin-echo scheme successively comprises a spatially selective 90° rf-pulse, a phase-encoding magnetic field gradient, a 180° rf-pulse and a measurement gradient applied during occurrence of an excited spin-echo resonance signal.

14. Magnetic resonance method according claim 11, characterized in that the chemical shift component is lipid.

* * * * *